(12) United States Patent
Higby et al.

(10) Patent No.: US 11,026,324 B2
(45) Date of Patent: Jun. 1, 2021

(54) CREATING A SECURE VOLUME

(71) Applicant: INTERNATIONAL BUSINESS MACHINES CORPORATION, Armonk, NY (US)

(72) Inventors: Arthur Higby, Cottekill, NY (US); David Long, Wappingers Falls, NY (US); Michael Fisher, Poughkeepsie, NY (US); James Busby, New Paltz, NY (US); John R. Dangler, Rochester, MN (US); Robert Weiss, Dutchess, NY (US); Zachary Thomas Dreiss, Beacon, NY (US); Rorie Paul Reyes, Kingston, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/278,814

(22) Filed: Feb. 19, 2019

(65) Prior Publication Data

US 2020/0267830 A1     Aug. 20, 2020

(51) Int. Cl.
*H05K 1/02*     (2006.01)
*H05K 1/03*     (2006.01)

(52) U.S. Cl.
CPC .......... *H05K 1/028* (2013.01); *H05K 1/0206* (2013.01); *H05K 1/0393* (2013.01); *H05K 2201/056* (2013.01)

(58) Field of Classification Search
CPC .... H05K 1/0206; H05K 1/028; H05K 1/0281; H05K 1/0283; H05K 1/0393; H05K 1/118; H05K 1/147; H05K 1/189; H05K 3/326; H05K 3/361; H05K 3/4635; H05K 2201/055; H05K 2201/056; H05K 2201/057; H01H 2229/038; B32B 37/18; B32B 38/0036; B32B 2038/0048; B32B 41/00

See application file for complete search history.

(56) References Cited

U.S. PATENT DOCUMENTS

| | | |
|---|---|---|
| 5,428,190 A | 6/1995 | Stopperan |
| 6,292,370 B1 | 9/2001 | Anderson et al. |
| 6,444,921 B1 | 9/2002 | Wang et al. |
| 7,595,550 B2 | 9/2009 | Cady et al. |
| 8,166,642 B2 | 5/2012 | Heisen et al. |

(Continued)

*Primary Examiner* — George R Koch
(74) *Attorney, Agent, or Firm* — Cantor Colburn LLP; Tihon Poltavets (57) ABSTRACT

Embodiments of the invention are directed to a method for creating a secure volume. A method includes adhering a flexible circuit to a surface of an enclosure. A first portion of the flexible circuit extends outward from the perimeter of the enclosure. A second portion of the flexible circuit is adhered to the center portion of the enclosure. Pressure is applied to the flexible circuit to ensure that it is affixed to the enclosure. The flexible circuit and the enclosure are then subjected to an annealing temperature. The duration and temperature are based on the adhesive and flexible circuit material. The extended portion of the flexible circuit is coated with an adhesive and folded over the second portion of the flexible circuit. Pressure is applied to the folded flexible circuit. The folded flexible circuit is then subjected to an annealing temperature.

9 Claims, 4 Drawing Sheets

(56) References Cited

U.S. PATENT DOCUMENTS

| | | |
|---|---|---|
| 9,554,477 B1 | 1/2017 | Brodsky et al. |
| 9,555,606 B1 * | 1/2017 | Fisher .................... H05K 3/284 |
| 9,578,764 B1 | 2/2017 | Fisher et al. |
| 9,591,776 B1 | 3/2017 | Brodsky et al. |
| 2012/0044637 A1 * | 2/2012 | Rothkopf .............. G06F 1/1626 |
| | | 361/679.55 |
| 2016/0163428 A1 | 6/2016 | Blackmer et al. |
| 2017/0094820 A1 | 3/2017 | Brodsky et al. |
| 2017/0171999 A1 * | 6/2017 | Fisher .................. H05K 5/0208 |

* cited by examiner

CREATING A SECURE VOLUME

BACKGROUND

The present invention generally relates to flexible circuits, and more specifically, to methods and devices for creating a secure volume.

Flexible circuits provide light, robust, and compact interconnections to enable operation of modern electronic devices. The circuits are formed from layers of conductive materials that can be affixed to substrates to enable complex circuit designs. Due to the flexible nature of the circuits, it is important to consider the thickness of the circuit traces, the degree of bending, and the manner of the bend formation. Flexible circuits offer several advantages including dynamic flexing and favorable heat dissipation. The light and compact nature of flexible circuits also make them ideal to match the demands of modern electronics.

SUMMARY

Embodiments of the present invention are directed to a method for creating a secure volume. A non-limiting example of the method includes adhering a flexible circuit to a surface of an enclosure. A first portion of the flexible circuit extends outward from the perimeter of the enclosure. A second portion of the flexible circuit is adhered to the center portion of the enclosure. Pressure is applied to the flexible circuit to ensure that it is affixed to the enclosure. The flexible circuit and the enclosure are subjected to an annealing temperature. The duration and temperature are based on the adhesive and flexible circuit material. The extended portion of the flexible circuit is coated with an adhesive and folded over the second portion of the flexible circuit. Pressure is applied to the folded flexible circuit to tighten the crease. The folded flexible circuit is then subjected to an annealing temperature.

Embodiments of the present invention are further directed to a system for creating a secure volume. The system includes a memory and a hardware processor communicatively coupled to the memory. The processor is configured to cause the system to perform the method.

Embodiments of the invention are directed to a computer program product for creating a secure volume. Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As electrical devices get smaller and more complex, the space available for additional components or connections is becoming reduced. For several electronic devices, components are enclosed within a housing and a gap is created between the components and the housing. A flexible circuit could be fitted between the components and the housing. The industry standard for a bend ratio of a flexible circuit is 20:1.

However, this ratio creates a large gap between the traces of a folded flexible circuit. Depending on the amount of available space between the component and the housing, the gap may be large enough to disqualify the available space from being used for the flexible circuit. Furthermore, conventional methods of fabricating and manipulating flexible circuits cannot achieve a bend ratio greater than the industry standard of 20:1 without a noticeable decrease in electrical and mechanical performance.

Turning now to an overview of technologies that are more specifically relevant to aspects of the invention. A flexible circuit includes at least one conductive material and at least one layer of a flexible substrate. The conductive material can be on a surface of the flexible substrate or surrounded by the flexible substrate. The flexible substrate can be a conductive or an insulating material. The flexible circuit is used to connect two or more electrical components.

The conductive material is formed from copper, gold, silver, conductive ink, or some other conductive material. The conductive material provides a medium for an electrical signal between the two or more electrical components.

In some embodiments, the conductive material is a wire and the flexible substrate is an insulating material coated around the wire. In some embodiments, the flexible substrate includes multiple wires for input and output functions. In some embodiments, each wire is coated by the flexible substrate to provide insulation. In other embodiments, the wires are separated from each other, but placed on top of a flexible substrate. The flexible substrate material includes acrylics, polyimides, polycarbonates, polyesters, mylars, plastics, or other insulating materials.

The flexible circuit should be fabricated to have a thickness that is thin enough that bending the circuit does not cause damage due to mechanical stress and strain. The flexible circuit should also be thick enough that an electrical signal can propagate through the flexible circuit. The degree of the thickness varies based on the degree of bending that the flexible circuit is subjected to.

The conductive material is patterned on or within the flexible substrate through various techniques including but not limited to photolithography, deposition, and screen printing. In some embodiments, a conductive material is patterned on a first flexible substrate layer and a second flexible substrate layer is laid on top of the conductive material. In other embodiments, the flexible circuit is made from one or more layers of conductive material positioned between layers of flexible substrates. In some embodiments, the conductive material is a uniform material throughout the flexible circuit. In other embodiments, the conductive material includes multiple conductive materials.

In other embodiments, the flexible substrate is made from a conductive material. In this instance, the flexible circuit is made only from the flexible substrate and the two or more components are connected via the flexible substrate. The flexible substrate is made from either a single conductive material or from several layers of different conductive materials. As described above and in more detail below, the thickness of the flexible circuit should consider any mechanical stress or strain caused by a bend and the durability and reliability of the electrical signal.

The bend ratio is the ratio between the radius of an imaginary circular object that the flexible circuit is bent around and the thickness of the flexible circuit. The industry standard for a bend ratio of a flexible circuit is 20:1. In other words, the flexible circuits bend radius is at least twenty times greater than the thickness of the flexible circuit. This ratio is designed to protect the flexible circuit from mechanical stress and strain caused by bending.

Turning now to an overview of the aspects of the invention, one or more embodiments of the invention address the above-described shortcomings of the prior art by providing devices and methods that produce a flexible circuit with a bend ratio greater than the industry standard without a reduction in reliability or performance. The flexible circuit is disposed between a housing and printed circuit board with limited available space. Additionally, no vias are exposed to the outside of this secure volume. The tighter bend enables the flexible surface to be used in smaller electronic devices with tighter available space.

Figure 1A:
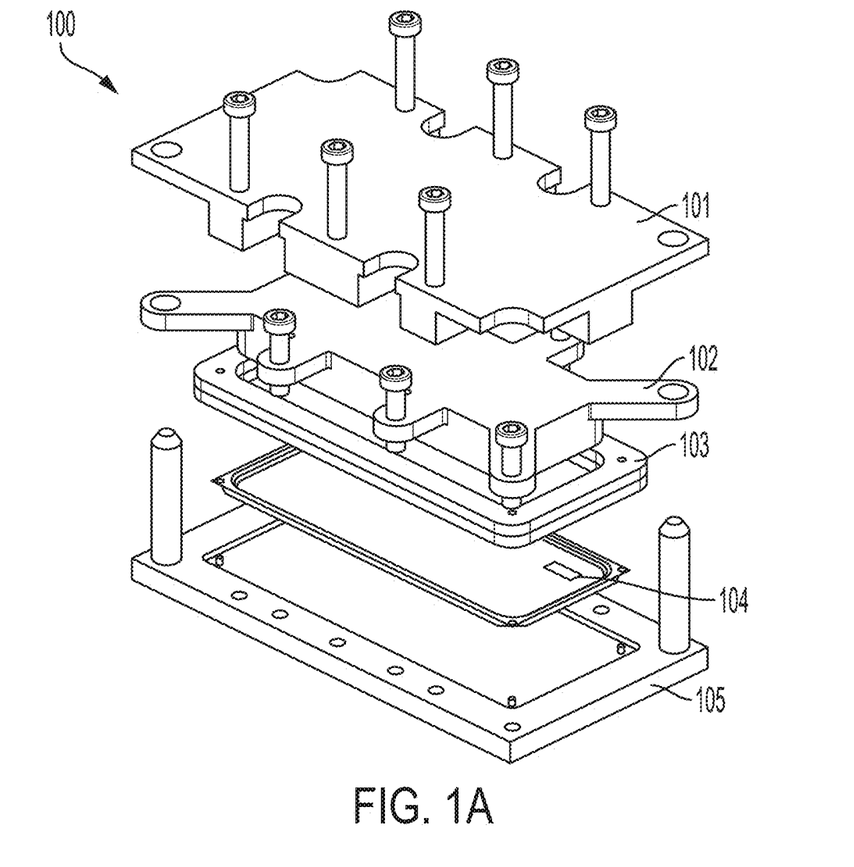
FIG. 1a depicts an exploded diagram of a compression device according to one or more embodiments of the present invention.

Turning now to a more detailed description of aspects of the present invention, FIG. 1 depicts an exploded diagram of a compression device 100 for bending a flexible circuit according to embodiments of the invention. Referring to FIG. 1a, the compression device 100 includes a top ram 101 for applying a force on the circumference of an enclosure 104. The top ram 101 has an upper surface and a bottom surface that extends away from the top surface along the perimeter of the top ram 101. The center of the bottom surface is not extended and provides a hollow space in the top ram 101.

A center ram 102 is used to apply a force to a center portion of an enclosure 104. The center ram 102 has a width such that center ram 102 fits in the hollow space of the top ram 101. If the enclosure 104 is depressed, the center ram 102 applies pressure to a depressed portion of the enclosure 104. In some embodiments, a cushioning material is positioned between the top ram 101 and the center ram 102 to hinder any damage that could be caused by compressing the top ram 101 and the center ram 102 together.

The compression device 100 includes a picture frame 103 for evenly distributing the force from the top ram 101 across the circumference of the enclosure. As depicted here, the picture frame 103 structure is rectangular and mirrors the perimeter of the enclosure 104. In other embodiments, the picture frame structure is either oval, circular, or other shape to mirror the perimeter of the enclosure 104. The center of the picture frame is open to permit the center ram 102 to protrude through and apply a force to the center of the enclosure 104. The length and width of the picture frame 103 correspond to the portions of the top ram 101 that extend away from the upper surface. The top ram 101 applies a force to the picture frame 103, which absorbs the force and distributes it along the circumference of the enclosure 104. An enclosure 104 is placed between the center ram 102 and a base plate 105. The enclosure 104 is fabricated from a metal material, including aluminum, magnesium, titanium, or alloy thereof.

Figure 1B:
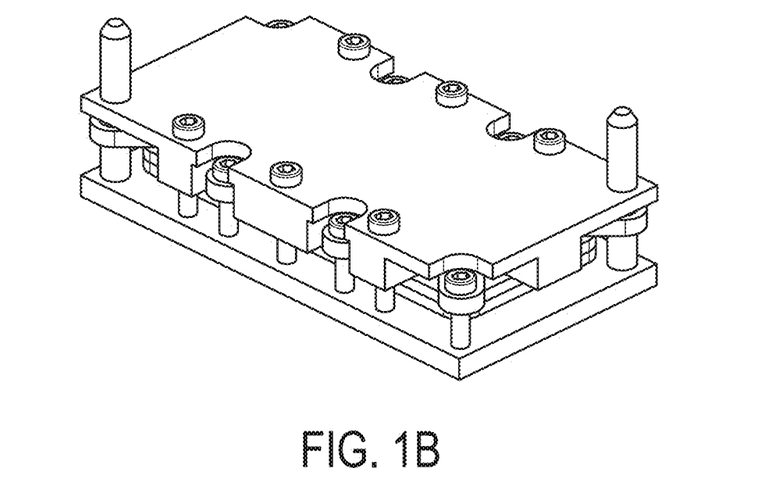
FIG. 1b depicts a diagram of the compression device in a compressed state according to one or more embodiments of the present invention.

As depicted in FIG. 1, the individual components of the device are connected via screws. The compression device 100 is compressed by tightening each screw. It should be appreciated that the device can be connected and compressed by different methods including actuators, bolts, and other mechanical methods. FIG. 1b depicts the compression device 100 in a compressed state. In the diagram is shown a set of six screws that connect the top ram 101 to the base plate 105. There is also shown a second set of eight screws that connect the center ram 102 to the base plate 105. It should be appreciated that the number of screws is for illustration and any number of screws could be used to connect the top ram 101 and the center ram 102 to the base plate 105.

Figure 2A:
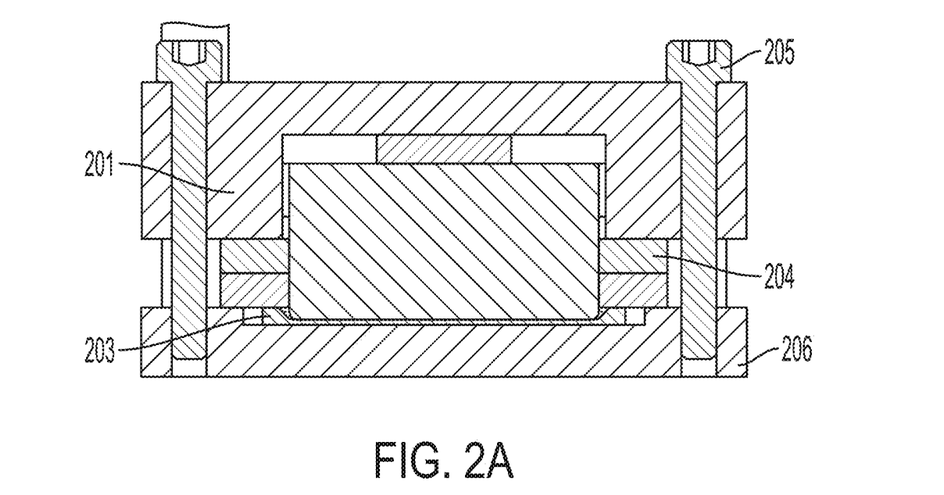
FIG. 2a depicts a cross-sectional diagram of the compression device illustrating a top ram applying pressure to an enclosure according to one or more embodiments of the present invention.
Figure 2B:
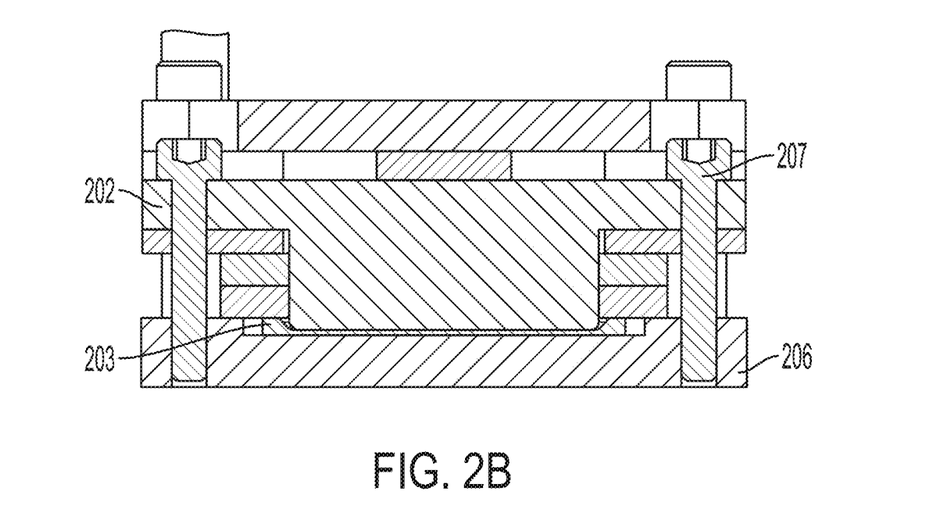
FIG. 2b depicts a cross-sectional diagram of the compression device illustrating a center ram applying pressure to an enclosure according to an enclosure according to one or more embodiments of the present invention.

FIG. 2 depicts two cross-sectional illustrations showing the top ram 201 and the center ram 202 applying a force to an enclosure 203. Referring to FIG. 2a, the top ram 201 is applying a downward force to the picture frame 204. The enclosure 203 has a depressed center portion and a raised circumference. The picture frame 204 is evenly applying pressure to the raised circumference of the enclosure 203. FIG. 2b shows a cross-sectional diagram of the center ram 202 applying a force to a depressed center portion of the enclosure 203. The top ram 201 is connected to the base plate 206 by a set of screws 205. The center ram 202 is connected to the base plate 206 by a second set of screws 207.

Figure 3A:
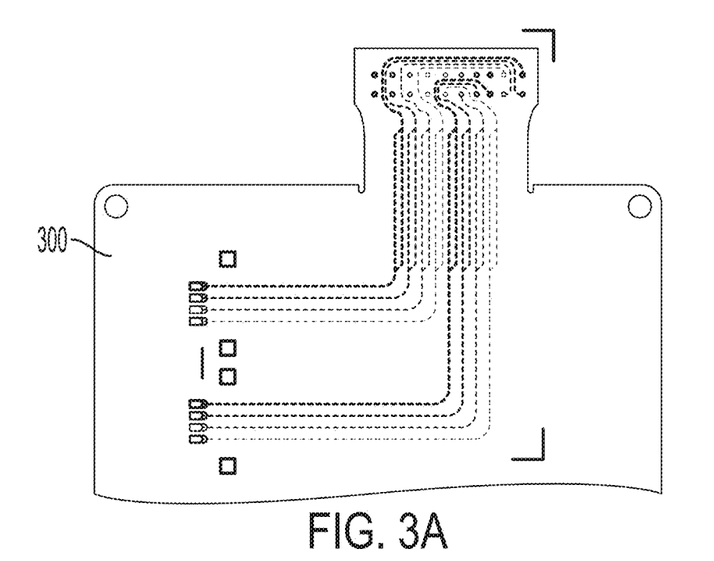
FIG. 3a depicts a circuit diagram of a flexible circuit according to one or more embodiments of the present invention.
Figure 3B:
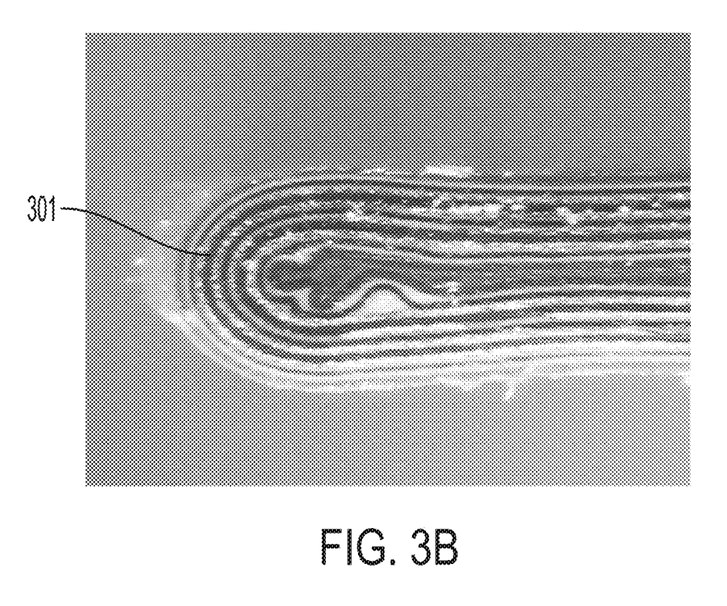
FIG. 3b depicts an image of a flexible circuit according to one or more embodiments of the present invention.

FIG. 3a depicts a diagram of a flexible circuit 300 and FIG. 3b depicts an image of a folded flexible circuit 301. As can be seen in FIG. 3a the flexible circuit includes four input lines and four output lines. Each circuit line has been split to form a primary circuit line and a redundant circuit line to increase the robustness of the circuit lines at a potential bending point. Referring to FIG. 3b, the gap in the middle of the fold is thinner than the thickness of the flexible circuit. In this image, the thickness of the flexible circuit is 8 mills. One mill is equal to $1/1000$ of an inch. Industry standards require a bend radius of 160 mills. However, using the devices and methods described herein, a bend radius of less than 2 mills is achieved. In some instances, a bend radius of near 0 is achieved. This bend radius is achieved without a noticeable depreciation in electrical or mechanical performance.

Figure 4:
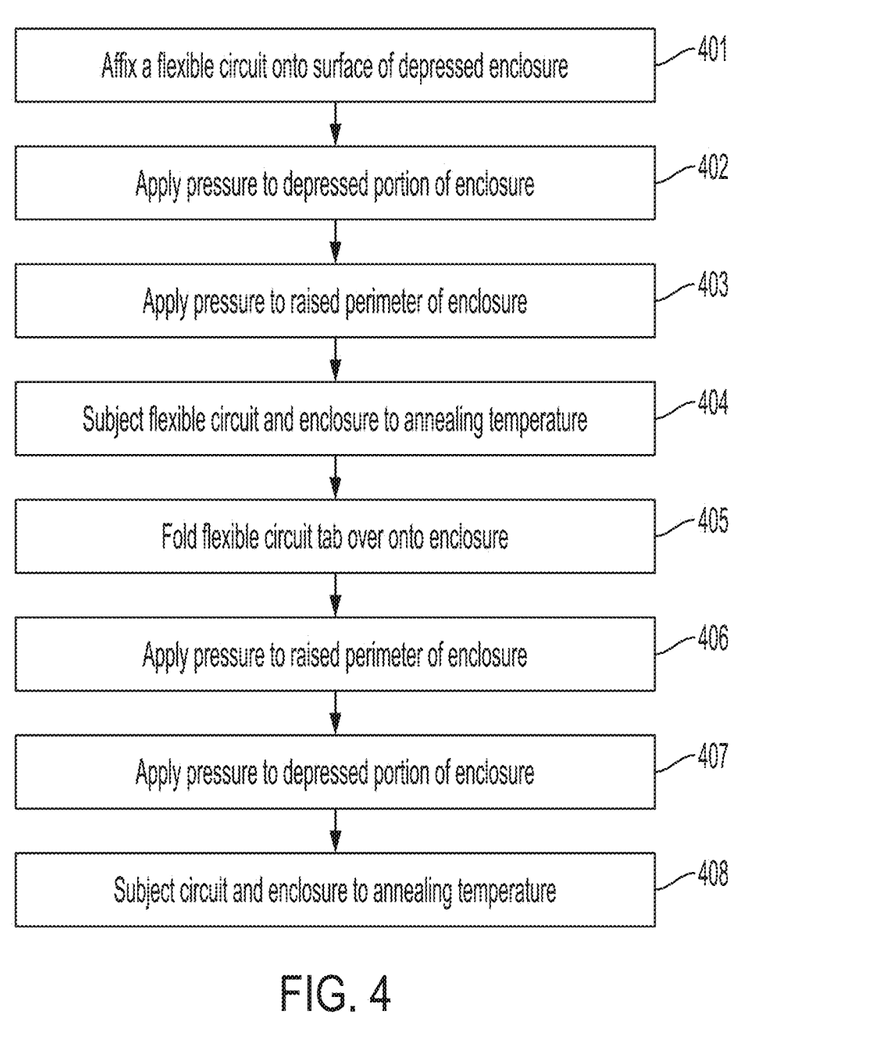
FIG. 4 depicts a flow diagram of a method for creating a secure volume according to one or more embodiments of the invention.

FIG. 4 depicts a flow diagram of a method for creating a secure volume according to one or more embodiments of the invention. The method 400 includes affixing a flexible circuit to the surface of a depressed enclosure at block 401. The flexible circuit is affixed with an adhesive to the enclosure. The flexible circuit should be placed flat as to be flush with a raised and depressed portion of the enclosure. A portion or tab of the flexible circuit should extend outward from the enclosure. The enclosure with the exposed flexible circuit tab is placed on a base plate of a compression device as described above.

The compression device applies pressure to the flexible circuit at the depressed center portion of the enclosure at block 402. The compression device also applies pressure to the flexible circuit at the raised perimeter of the enclosure at block 403. The compression device applies pressure evenly along the perimeter of the enclosure. The compression device applies pressure to this raised perimeter to ensure that the tab is properly affixed to the outer edge of the raised portion of the enclosure. After pressing the flexible circuit, the circuit is exposed to an annealing temperature at block 404. The temperature range and duration are based on the flexible circuit material and the adhesive.

The flexible circuit tab is folded upward from the base of the base plate. Once the flexible circuit tab is folded upward, it is not permitted to fold back towards its original state. Keeping the tab folded upward helps ensure the crispness of the fold and the higher bend ratio. An adhesive is applied to the flexible circuit tab and the flexible circuit is folded forward such that the tab is connected to the bottom portion of the fold by the adhesive at block 405. In some embodiments, a hinged plate is placed against the flexible circuit tab to prevent the tab from relaxing back towards its original state. The metal plate revolves upward along the hinge to force the flexible circuit into the upward position. After the adhesive has been applied, the hinged plate is further revolved to force the tab to fold over and connect to the flexible circuit. Once the tab is in contact with the upper surface of the flexible circuit, a force is applied to the flexible circuit to compress the area between the tab and the flexible circuit.

The compression device applies pressure to the flexible circuit at the raised perimeter of the enclosure at block 406. Applying pressure to the flexible circuit at the raised portion prior to the depressed portion helps form the crease between the top portion of the fold and the bottom portion of the fold. The compression device applies pressure to the flexible circuit at the depressed center portion of the enclosure at block 407. The top portion of the fold is properly affixed to the bottom portion of the fold due to pressure applied to the center portion of the enclosure. The flexible circuit and the enclosure are subjected to an annealing temperature to cure the flexible circuit at block 408. The duration and range of the annealing temperature are determined based on the flexible circuit material and the adhesive. The enclosure is covered to with the folded flexible circuit inside to create the secure volume. The volume being the space within the covered enclosure. Any exposed vias from the folded flexible circuit are within the secure volume to hinder unintended contact with the vias. The secure volume is used for different electronic devices that need to accommodate low-profile components in limited areas.

Additional processes may also be included. It should be understood that the processes depicted in FIG. 4 represent illustrations, and that other processes may be added or existing processes may be removed, modified, or rearranged without departing from the scope and spirit of the present disclosure.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system for creating a secure volume, the system comprising:
    a processor communicatively coupled to a memory, the processor configured to cause the system to:
        adhere a flexible circuit to a surface of an enclosure, wherein a first portion of the flexible circuit extends away from a perimeter of the enclosure, and wherein a second portion of the flexible circuit is adhered to a center portion of the enclosure;
        apply a first pressure to the flexible circuit;
        subject the flexible circuit and the enclosure to an annealing temperature;

fold the first portion of the flexible circuit over the second portion of the flexible circuit to form a folded flexible circuit;

apply a second pressure to the folded flexible circuit; and subject the folded flexible circuit and the enclosure to the annealing temperature.

2. The system of claim 1, wherein to fold the first portion of the flexible circuit, the processor is further configured to cause the system to:

fold the first portion upward from the second portion of the flexible circuit;

apply an adhesive to an inner surface of the first portion; and adhere the inner surface of the first portion to a top surface of the second portion.

3. The system of claim 1, wherein to apply the first pressure to the flexible circuit, the processor is further configured to cause the system to:

apply the first pressure to a depressed center portion of the enclosure; and apply the first pressure to a raised perimeter of the enclosure.

4. The system of claim 1, wherein prior to folding the first portion of the flexible circuit, pressure is first applied to the flexible circuit at the center portion of the enclosure and then pressure is applied to the flexible circuit at the perimeter of the enclosure.

5. The system of claim 1, wherein after folding the first portion of the flexible circuit, pressure is first applied to the flexible circuit at the perimeter of the enclosure and then pressure is applied to the flexible circuit at the center portion of the enclosure.

6. The system of claim 1, wherein the flexible circuit comprises wire traces at a bending point.

7. A computer program product for creating a secure volume, the computer product comprising a computer readable storage medium having program instructions embodied therewith, the instructions executable by a processor to cause the processor to cause a system to:

adhere a flexible circuit to a surface of an enclosure, wherein a first portion of the flexible circuit extends away from a perimeter of the enclosure, and wherein a second portion of the flexible circuit is adhered to a center portion of the enclosure;

apply a first pressure to the flexible circuit;

subject the flexible circuit and the enclosure to an annealing temperature;

fold the first portion of the flexible circuit over the second portion of the flexible circuit to form a folded flexible circuit;

apply a second pressure to the folded flexible circuit; and subject the folded flexible circuit and the enclosure to the annealing temperature.

8. The computer program product of claim 7, wherein to fold the first portion of the flexible circuit, the processor is further configured to cause the system to:

fold the first portion upward from the second portion of the flexible circuit;

apply an adhesive to an inner surface of the first portion; and adhere the inner surface of the first portion to a top surface of the second portion.

9. The computer program product of claim 7, wherein to apply the first pressure to the flexible circuit, the processor is further configured to cause the system to:

apply the first pressure to a depressed center portion of the enclosure; and apply the first pressure to a raised perimeter of the enclosure.

* * * * *